(12) United States Patent
Zhou

(10) Patent No.: US 12,022,686 B2
(45) Date of Patent: Jun. 25, 2024

(54) MANUFACTURING METHOD OF OLED PANEL AND OLED PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Xingyu Zhou, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 797 days.

(21) Appl. No.: 16/973,012

(22) PCT Filed: Nov. 25, 2020

(86) PCT No.: PCT/CN2020/131386
§ 371 (c)(1),
(2) Date: Dec. 7, 2020

(87) PCT Pub. No.: WO2022/048044
PCT Pub. Date: Mar. 10, 2022

(65) Prior Publication Data
US 2022/0320473 A1    Oct. 6, 2022

(30) Foreign Application Priority Data
Sep. 3, 2020   (CN) .......................... 202010914076.0

(51) Int. Cl.
*H10K 50/86*    (2023.01)
*H10K 59/12*    (2023.01)
(Continued)

(52) U.S. Cl.
CPC ......... *H10K 50/865* (2023.02); *H10K 59/122* (2023.02); *H10K 71/00* (2023.02);
(Continued)

(58) Field of Classification Search
None
See application file for complete search history.

(56) References Cited

U.S. PATENT DOCUMENTS

| | | | | |
|---|---|---|---|---|
| 2011/0147757 A1* | 6/2011 | Kim | ..................... | H01L 27/1255 257/E33.001 |
| 2019/0172954 A1* | 6/2019 | Zhou | ................. | H01L 21/47635 |
| 2019/0206972 A1* | 7/2019 | Park | ..................... | H01L 27/124 |

FOREIGN PATENT DOCUMENTS

| | | |
|---|---|---|
| CN | 103904086 A | 7/2014 |
| CN | 108957884 A | 12/2018 |

(Continued)

*Primary Examiner* — Evren Seven
*Assistant Examiner* — Cole Leon Lindsey
(74) *Attorney, Agent, or Firm* — The Roy Gross Law Firm, LLC; Roy Gross

(57) ABSTRACT

The present application provides a manufacturing method of an organic light-emitting diode (OLED) panel and the OLED panel. Conventional OLED panels have problems like low aperture ratios and low capacitance. The present application overlaps a first conductive layer and a light shielding layer, a pixel electrode is connected to a source, and a planarization layer and a passivation layer in a capacitor area are removed. Therefore, an aperture ratio and capacitance of the OLED panel are greatly improved, the present application has a high degree of design freedom to be used in larger-sized OLED panels, and capacitance retention is improved.

18 Claims, 4 Drawing Sheets

(51) Int. Cl.
*H10K 59/122* (2023.01)
*H10K 71/00* (2023.01)
*H10K 102/10* (2023.01)

(52) U.S. Cl.
CPC ... *H10K 59/1201* (2023.02); *H10K 2102/102* (2023.02); *H10K 2102/103* (2023.02)

(56) References Cited

FOREIGN PATENT DOCUMENTS

| CN | 109696781 A | 4/2019 |
| CN | 110943112 A | 3/2020 |
| CN | 111276493 A | 6/2020 |
| CN | 111584593 A | 8/2020 |

* cited by examiner

MANUFACTURING METHOD OF OLED PANEL AND OLED PANEL

CROSS REFERENCE TO RELATED APPLICATIONS

This application is a National Phase of PCT Patent Application No. PCT/CN2020/131386 having International filing date of Nov. 25, 2020, which claims the benefit of priority of Chinese Application No. 202010914076.0 filed on Sep. 3, 2020. The contents of the above applications are all incorporated by reference as if fully set forth herein in their entirety.

FIELD OF DISCLOSURE

The present application relates to a field of display technology and in particular, to a manufacturing method of an organic light-emitting diode (OLED) panel and the OLED panel.

DESCRIPTION OF RELATED ART

Compared with liquid crystal displays (LCDs), the organic light-emitting devices (OLEDs) have the advantages of self-luminescence, fast response, wide viewing angles, high brightness, bright colors, being thin and light, and are considered as the next generation display technology. For a bottom-emission OLED display panel, an aperture ratio and capacitance of a capacitor are some important parameters to evaluate a product.

FIG. 1 is a structural view illustrating a conventional organic light-emitting diode (OLED) panel. As shown in FIG. 1, the panel comprises a substrate 101, a light shielding layer 102, a first conductive layer 103, a buffer layer 104, an active layer 105, a second conductive layer 106, a gate insulating layer 107, a gate 108, a second insulating layer 109, a source 110, a drain 111, a passivation layer 112, a planarization layer 113, a pixel electrode 114, and a pixel definition layer 115. In conventional techniques, the first conductive layer 103, the buffer layer 104, and the second conductive layer 106 are used as a transparent capacitor structure in a bottom-emission OLED panel. Since the transparent capacitor structure does not affect a capacitor area, the aperture ratio increases, but the capacitance is limited.

Therefore, how to improve both the aperture ratio and the capacitance of the OLED panel has become a technical problem in need of solutions and research.

SUMMARY

The present invention provides a manufacturing method of an organic light-emitting diode (OLED) panel. Conventional OLED panels have the problems of low aperture ratios and low capacitance. The present invention overlaps a first conductive layer and a light shielding layer, a pixel electrode is connected to a source, and a planarization layer and a passivation layer in a capacitor area are removed. Therefore, an aperture ratio and capacitance of the OLED panel of the present application are greatly improved, and the present application has a high degree of design freedom to be used in larger-sized OLED panels and improves capacitance retention.

Accordingly, the present invention provides a manufacturing method of an OLED panel and an OLED panel to solve the problems of low aperture ratios and low capacitance of the conventional OLED panel.

Accordingly, the present invention provides the following solution.

In one aspect, the present invention provides a manufacturing method of an organic light-emitting diode (OLED) panel, comprising following steps:

forming a light shielding layer on a substrate;

coating a transparent metal oxide onto the substrate and the light shielding layer, and patterning the transparent metal oxide to form a first conductive layer, wherein one end of the first conductive layer is overlapped with the light shielding layer;

sequentially depositing a buffer layer, a semiconductor layer, a first insulating layer, and a first metal layer on the substrate, and patterning the semiconductor layer, the first insulating layer, and the first metal layer to form a first semiconductor layer, a second semiconductor layer, a gate insulating layer, and a gate, wherein the first semiconductor layer and the second semiconductor layer are spaced apart from each other;

by using the gate and the gate insulating layer as a shield, performing plasma treatment on the first semiconductor layer and the second semiconductor layer to obtain an active layer and a second conductive layer spaced apart from the active layer;

forming a second insulating layer which covers the buffer layer, the active layer, the second conductive layer, the gate insulating layer, the gate insulating layer, and the gate, and patterning the second insulating layer and the buffer layer to form a first via hole which exposes the active layer, a second via hole which exposes the active layer, and a third via hole which exposes the light shielding layer;

forming a second metal layer on the second insulating layer, and patterning the second metal layer to form a source and a drain, wherein the drain is connected to the active layer through the first via hole, the source is connected to the active layer through the second via hole, and the source is connected to the light shielding layer through the third via hole;

forming a passivation layer covering the second insulating layer, the source, and the drain;

forming a planarization layer covering the passivation layer, and patterning the passivation layer and the planarization layer to form a fourth via hole which exposes the source and to form an opening which exposes the second insulating layer;

coating the planarization layer and the opening with a transparent metal oxide, and patterning the transparent metal oxide to form a pixel electrode, wherein the pixel electrode is connected to the source through the fourth via hole; and forming a pixel definition layer covering the planarization layer and the pixel electrode, and patterning the pixel definition layer to expose the pixel electrode located above the opening.

According to one embodiment of the present invention, the first conductive layer, the buffer layer, the second conductive layer, the second insulating layer, and the pixel electrode form a three-layer transparent capacitor structure.

Furthermore, a material of the light shielding layer is one or more kinds of material selected from a group comprising molybdenum (Mo), aluminum (Al), copper (Cu), and titanium (Ti);

a thickness of the light shielding layer ranges from 2000 Å to 10000 Å; and a thickness of the first conductive layer ranges from 200 Å to 2000 Å.

Moreover, the fourth via hole is formed by photolithography.

A thickness of the semiconductor layer ranges from 100 Å to 1000 Å;
  a material of the semiconductor layer is one of indium gallium zinc oxide (IGZO), indium zinc tin oxide (IZTO), and indium gallium zinc tin oxide (IGZTO);
  a thickness of the gate insulating layer ranges from 1000 Å to 3000 Å; and
  a material of the second metal layer is one or more kinds of material selected from a group comprising Mo, Al, Cu, and Ti, and a thickness of the source and the drain ranges from 2000 Å to 8000 Å.

A material of the second insulating layer is one or a combination of SiOx and SiNx; and
  a thickness of the second insulating layer ranges from 2000 Å to 10000 Å.

A material of the passivation layer is one or a combination of SiOx and SiNx;
  a thickness of the passivation layer ranges from 1000 Å to 5000 Å;
  a material of the pixel electrode is ITO or IZO; and
  a thickness of the pixel electrode ranges from 200 Å to 2000 Å.

The active layer is disposed above the light shielding layer;
  the second conductive layer is disposed above the first conductive layer; and
  the opening is arranged above the second conductive layer.

A width of the active layer is less than a width of the light shielding layer;
  a width of the gate insulating layer is less than a width of the active layer; and
  a width of the gate is less than the width of the gate insulating layer.

A thickness of the buffer layer ranges from 1000 Å to 5000 Å; and
  a material of the buffer layer is one or a combination of SiOx and SiNx.

In another aspect, the present invention provides an organic light-emitting diode (OLED) panel, comprising:
  a substrate;
  a light shielding layer formed on a surface of the substrate;
  a first conductive layer formed on a surface of the substrate, wherein one end of the first conductive layer is overlapped with the light shielding layer;
  a buffer layer covering the light shielding layer, the first conductive layer, and the substrate;
  an active layer formed on a surface of the buffer layer;
  a second conductive layer formed on a surface of the buffer layer, wherein the second conductive layer and the active layer are spaced apart from each other;
  a gate insulating layer formed on a surface of the active layer;
  a gate formed on a surface of the gate insulating layer;
  a second insulating layer covering the buffer layer, the active layer, the second conductive layer, the gate insulating layer, and the gate;
  a drain formed on a surface of the second insulating layer and connected to the active layer through a first via hole penetrating the second insulating layer;
  a source formed on a surface of the second insulating layer, connected to the active layer through a second via hole penetrating the second insulating layer, and connected to the light shielding layer through a third via hole penetrating the second insulating layer and the buffer layer;
  a passivation layer covering the buffer layer, the source, and the drain;
  a planarization layer formed on a surface of the passivation layer;
  a pixel electrode formed on a surface of the planarization layer, wherein the pixel electrode is connected to the source through a fourth via hole penetrating the planarization layer and the passivation layer, and the pixel electrode is in contact with the second insulating layer through an opening penetrating the planarization layer and the passivation layer; and
  a pixel definition layer formed on surfaces of the planarization layer and the pixel electrode, and exposing the pixel electrode above the opening.

Furthermore, the active layer is disposed above the light shielding layer;
  the second conductive layer is disposed above the first conductive layer; and
  the opening is arranged above the second conductive layer.

Moreover, a width of the active layer is less than a width of the light shielding layer;
  a width of the gate insulating layer is less than a width of the active layer; and
  a width of the gate is less than the width of the gate insulating layer.

The first conductive layer, the buffer layer, the second conductive layer, the second insulating layer, and the pixel electrode form a three-layer transparent capacitor structure.

A material of the light shielding layer is one or more kinds of material selected from a group comprising molybdenum (Mo), aluminium (Al), copper (Cu), and titanium (Ti);
  a thickness of the light shielding layer ranges from 2000 Å to 10000 Å; and
  a thickness of the first conductive layer ranges from 200 Å to 2000 Å.

The fourth via hole is formed by photolithography.

A thickness of the semiconductor layer ranges from 100 Å to 1000 Å;
  a material of the semiconductor layer is one of indium gallium zinc oxide (IGZO), indium zinc tin oxide (IZTO), and indium gallium zinc tin oxide (IGZTO);
  a thickness of the second metal layer ranges from 1000 Å to 3000 Å; and
  a material of the source and the drain is one or more of Mo, Al, Cu and Ti, and a thickness of the source and the drain ranges from 2000 Å to 8000 Å.

A material of the second insulating layer is one or a combination of SiOx and SiNx; and
  a thickness of the second insulating layer ranges from 2000 Å to 10000 Å.

A material of the passivation layer is one or a combination of SiOx and SiNx;
  a thickness of the passivation layer ranges from 1000 Å to 5000 Å;
  a material of the pixel electrode is ITO or IZO; and
  a thickness of the pixel electrode ranges from 200 Å to 2000 Å.

A thickness of the buffer layer ranges from 1000 Å to 5000 Å; and a material of the buffer layer is one or a combination of SiOx and SiNx.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DETAILED DESCRIPTION OF EMBODIMENTS

In the following, in conjunction with the accompanying drawings and with reference to the embodiments of the present application, a manufacturing method of an organic light-emitting diode (OLED) panel and the OLED panel will be clearly and completely described. Obviously, the described embodiments are only some of the embodiments of the present application, rather than all the embodiments. Based on the embodiments in the present application, all other embodiments obtained by those skilled in the art without creative work should be deemed to fall within the protection scope of the present application.

In the description of the present application, it should be understood that directional terms such as "center", "longitudinal", "transverse", "length", "width", "thickness", "upper", "lower", "front", "rear", "left", "right", "vertical", "horizontal", "top", "bottom", "inner", and "outer" indicate orientations or positional relationship based on the drawings. The directional terms are only for the convenience of describing the application and simplifying the description, rather than indicating or implying that the device or element referred to must have a specific orientation, be constructed and operated in a specific orientation, and therefore cannot be understood as a limitation of the present application. In addition, the terms "first" and "second" are only used for illustrative purposes, and cannot be understood as indicating or implying relative importance or implicitly indicating the number of indicated technical features. Thus, the features defined with "first" and "second" may explicitly or implicitly include one or more of the features. In the description of the present application, "multiple" means two or more than two, unless otherwise specifically defined.

In the present application, the word "example embodiment" is used to mean "serving as an example for illustration." Any embodiment described as "example embodiment" in the present application is not necessarily construed as being more preferred or advantageous over other embodiments. In order to enable persons skilled in the art to implement and use the present application, the following description is given. In the following description, the details are listed for illustrative purpose. It should be noted that those of ordinary skill in the art can realize that the present application can also be implemented without these specific details. In other instances, well-known structures and processes will not be elaborated to avoid unnecessary details to obscure the description of the present application. The present application is not intended to be limited to the described embodiments, but has the widest protection scope that corresponds to the principles and features disclosed in the present application.

Figure 1:
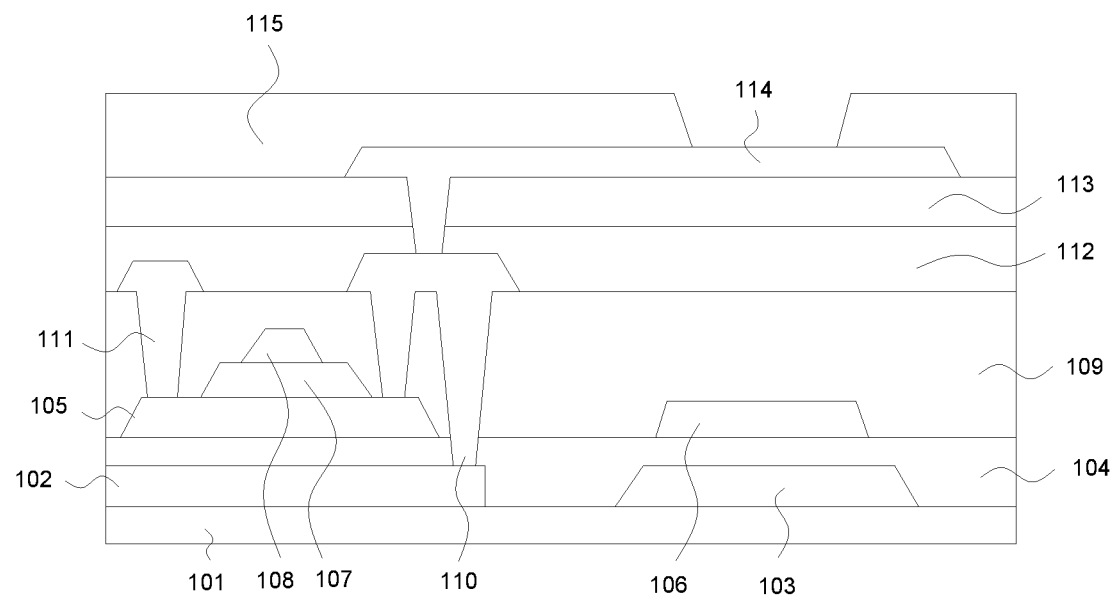
FIG. 1 is a structural view illustrating a conventional organic light-emitting diode (OLED) panel.
Figure 2:
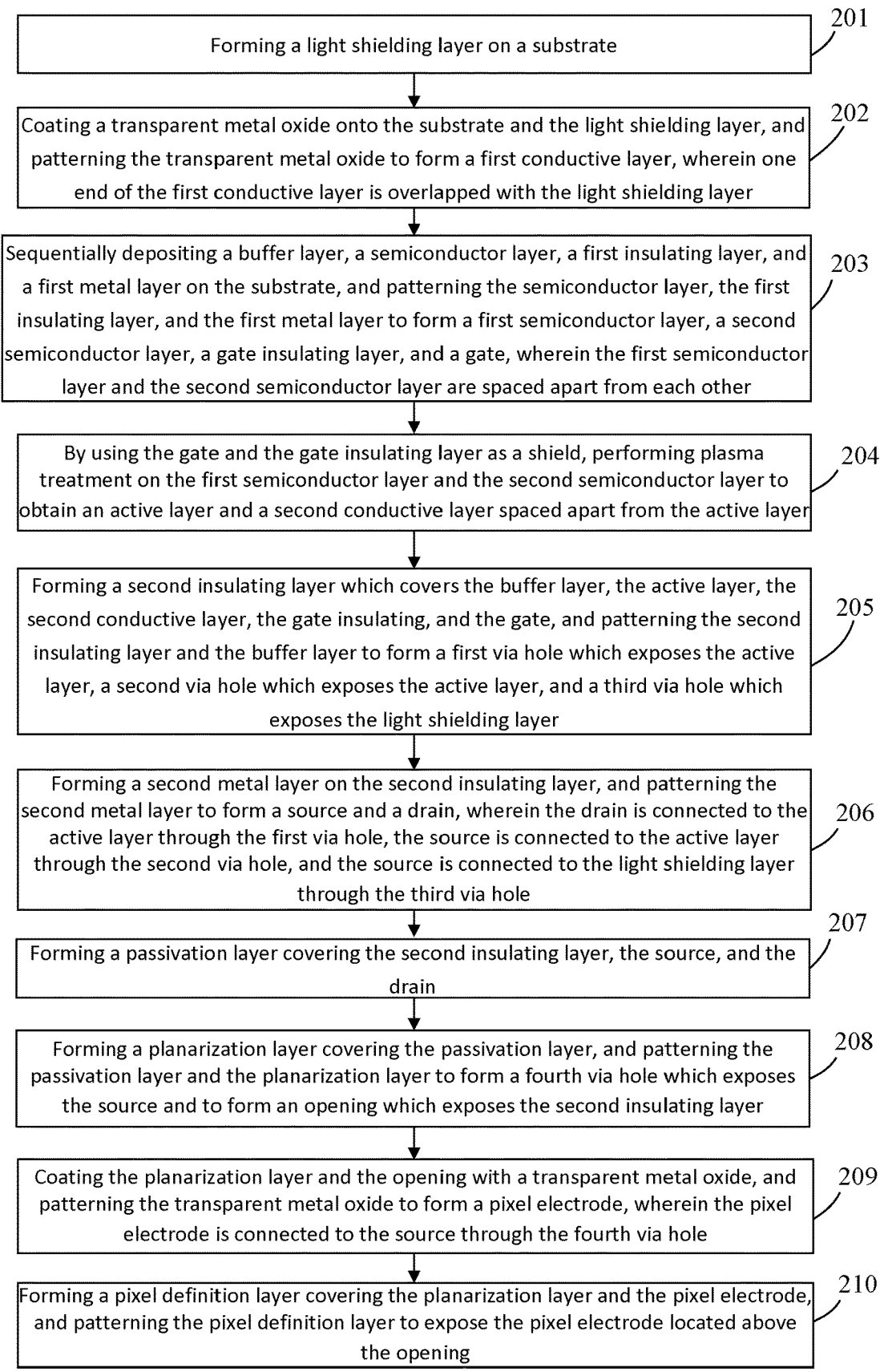
FIG. 2 is a process flow diagram illustrating a manufacturing method of the OLED panel according to one embodiment of the present application.

FIG. 2 is a process flow diagram showing a manufacturing method of an organic light-emitting diode (OLED) panel. As shown in FIG. 2, the manufacturing method of the OLED panel according to the present application comprises following steps:

step S201: forming a light shielding layer on a substrate;

step S202: coating a transparent metal oxide onto the substrate and the light shielding layer, and patterning the transparent metal oxide to form a first conductive layer, wherein one end of the first conductive layer is overlapped with the light shielding layer;

step S203: sequentially depositing a buffer layer, a semiconductor layer, a first insulating layer, and a first metal layer on the substrate, and patterning the semiconductor layer, the first insulating layer, and the first metal layer to form a first semiconductor layer, a second semiconductor layer, a gate insulating layer, and a gate, wherein the first semiconductor layer and the second semiconductor layer are spaced apart from each other;

step S204: by using the gate and the gate insulating layer as a shield, performing plasma treatment on the first semiconductor layer and the second semiconductor layer to obtain an active layer and a second conductive layer spaced apart from the active layer;

step S205: forming a second insulating layer which covers the buffer layer, the active layer, the second conductive layer, the gate insulating, and the gate, and patterning the second insulating layer and the buffer layer to form a first via hole which exposes the active layer, a second via hole which exposes the active layer, and a third via hole which exposes the light shielding layer;

step S206: forming a second metal layer on the second insulating layer, and patterning the second metal layer to form a source and a drain, wherein the drain is connected to the active layer through the first via hole, the source is connected to the active layer through the second via hole, and the source is connected to the light shielding layer through the third via hole;

step S207: forming a passivation layer covering the second insulating layer, the source, and the drain;

step S208: forming a planarization layer covering the passivation layer, and patterning the passivation layer and the planarization layer to form a fourth via hole which exposes the source and to form an opening which exposes the second insulating layer;

step S209: coating the planarization layer and the opening with a transparent metal oxide, and patterning the transparent metal oxide to form a pixel electrode, wherein the pixel electrode is connected to the source through the fourth via hole; and step S210: forming a pixel definition layer covering the planarization layer and the pixel electrode, and patterning the pixel definition layer to expose the pixel electrode located above the opening.

Figure 3:
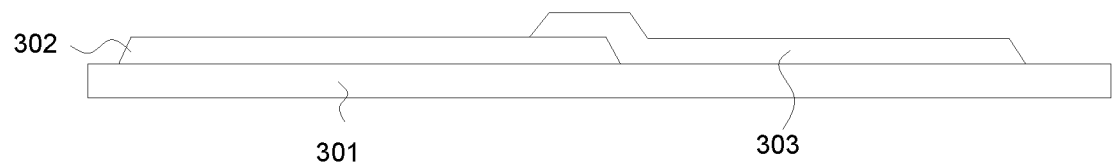
FIG. 3 is a structural view illustrating a first pattern layer according to one embodiment of the present application.

FIG. 3 is a first structural view illustrating a first pattern layer according to one embodiment of the present invention. As shown in FIG. 3, a light shielding layer 302 and a first conductive layer 303 are formed on a substrate 301 to form the first pattern layer. Preferably, the substrate 301 is cleaned first, and then a layer of metal is deposited on the substrate 301, wherein the metal is preferably Mo, Al, Cu, Ti, or an alloy, with a thickness of 2000 Å to 10000 Å, and the light shielding layer 302 is formed by patterning the metal through photolithography. Preferably, a layer of a conductive transparent metal oxide such as ITO or IZO or the like is deposited on the substrate 301, with a thickness of 200 Å to 2000 Å, and patterned as the first conductive layer 303 by photolithography. The first conductive layer 303 serves as an electrode plate of a capacitor, and the first conductive layer 303 and the light shielding layer 302 are directly overlapped with each other to connect signals.

Figure 4:
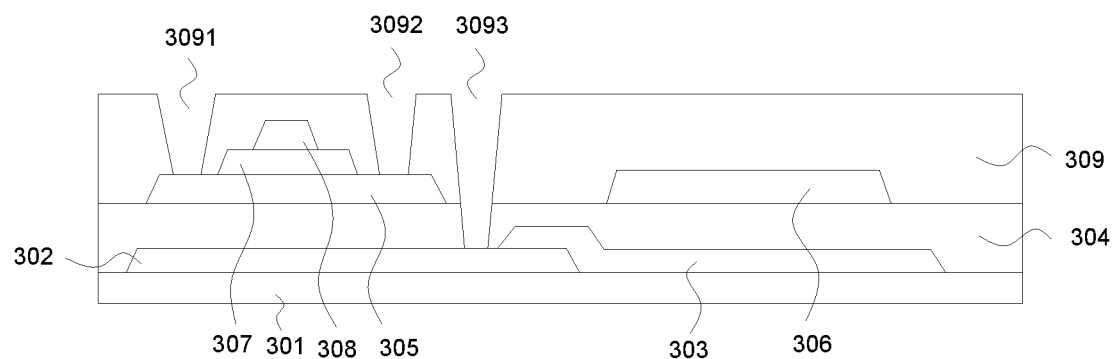
FIG. 4 is a structural view illustrating a second pattern layer according to one embodiment of the present application.

FIG. 4 is a structural view illustrating a second pattern layer according to one embodiment of the present invention. As shown in FIG. 4, a buffer layer 304, a second conductive layer 306, an active layer 305, a gate insulating layer 307, a gate 308, and a second insulating layer 309 are formed on the first pattern layer to form the second pattern layer. The buffer layer 304 can be a one-layer or multi-layer structure. A layer of a metal oxide semiconductor material is deposited. The metal oxide semiconductor material can be IGZO, IZTO, IGZTO, and etc., with a thickness of 100 Å to 1000 Å. The metal oxide semiconductor material is etched into a pattern to form a first semiconductor layer and a second semiconductor layer. A layer of SiOx or SiNx, or a multilayer structure film is deposited as a first insulating layer with a thickness of 1000 Å-3000 Å. A layer of metal is deposited as a first metal layer, which can be Mo, Al, Cu, Ti, etc., or an alloy, with a thickness of 2000 Å-8000 Å. Through photolithography, the gate 308 is formed by etching, and then a pattern of the gate 308 is used for self-alignment to etch the first insulating layer. Only under the film layer of the gate 308, the first insulating layer remains, and the rest of the first insulating layer is etched away to form a gate insulating layer 307. Plasma treatment is performed on an entire surface. For the second semiconductor layer that is not protected by the gate 308 and the gate insulating layer 307, the resistance is significantly reduced after the plasma treatment, so that an N+ conductive layer is formed, and a portion of the first semiconductor layer is also conductorized to form a low resistance region, but a part of the first semiconductor layer under the gate 308 does not go through the plasma treatment, and semiconductor characteristics of this part are maintained as a TFT channel. A second insulating layer 309 is deposited. A material of the second insulating layer 309 is ILD, SiOx or SiNx, or a multilayer structure film, with a thickness of 2000 Å-10000 Å. Photolithography and etching are performed on the second insulating layer 309 to form a first via hole 3091 exposing the active layer 305, a second via hole 3092 exposing the active layer 305, and a third via hole 3093 exposing the light shielding layer 302.

Figure 5:
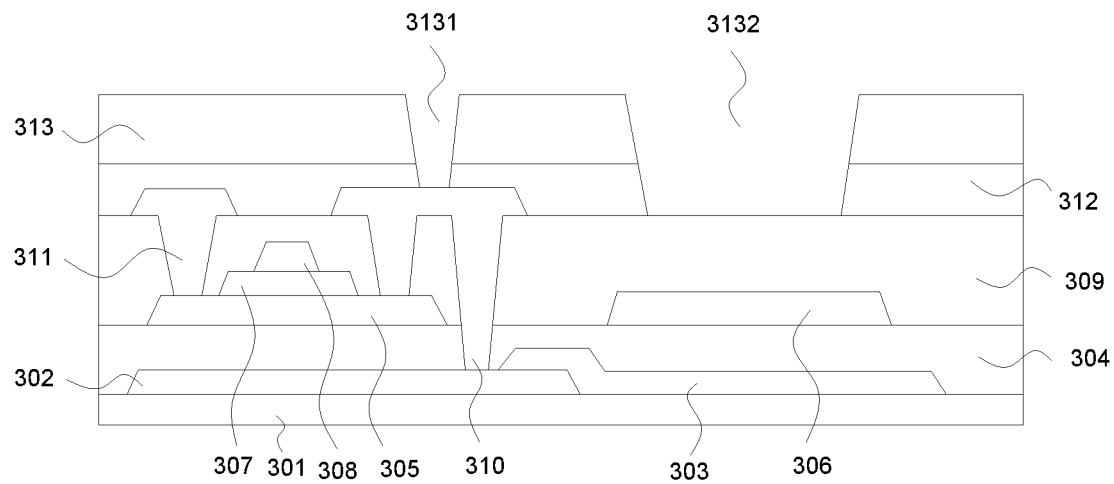
FIG. 5 is a structural view illustrating a third pattern layer according to one embodiment of the present application.

FIG. 5 is a third structural view illustrating a third pattern layer according to one embodiment of the present invention. As shown in FIG. 5, a source 310, a drain 311, a passivation layer 312, and a planarization layer 313 are formed on the second pattern layer to form the third pattern layer. A layer of metal is deposited as the source 310 and drain 311, which can be Mo, Al, Cu, Ti, etc., or an alloy, with a thickness of 2000 Å-8000 Å, and then a pattern is defined, wherein the source 310 is connected to the light shielding layer 302 below and the substrate below the capacitor. SiOx or SiNx or a multilayer structure film is deposited as the passivation layer 312, the passivation layer 312 has a thickness of 1000 Å-5000 Å. A layer of a photoresist material with a thickness of 0.5 um to 4 um is made as the planarization layer 313, a fourth via hole 3131 is formed in the planarization layer 313 by photolithography, and the planarization layer 313 and passivation layer 312 in an area with the capacitor are etched away to form an opening 3132.

A pixel electrode and a pixel definition layer are formed on the third pattern layer to complete the production of the OLED panel. The pixel electrode 314 is made of ITO or IZO or other conductive transparent metal oxide, a thickness of the pixel electrode 314 ranges from 200 Å to 2000 Å, and a pattern is made through photolithography. The pixel electrode is used as an anode of an OLED and is directly signal connected to the source 310 of an TFT. The pixel definition layer is made to complete the production of an OLED material, and the production of the OLED panel is completed after deposition of the cathode and encapsulation. In the present embodiment, the first conductive layer 303, the buffer layer 304, the second conductive layer 306, the second insulating layer 309, and the pixel electrode 314 form a three-layer transparent capacitor structure.

Compared with conventional techniques, the present invention overlaps the first conductive layer 303 and the light shielding layer 302, the pixel electrode is connected to the source 310, and the planarization layer 313 and passivation layer 312 in the area with the capacitor are removed. Therefore, an aperture ratio and capacitance of the OLED panel are greatly improved, and the present application has a high degree of design freedom to be used in larger-sized OLED panels and improves capacitance retention.

Figure 6:
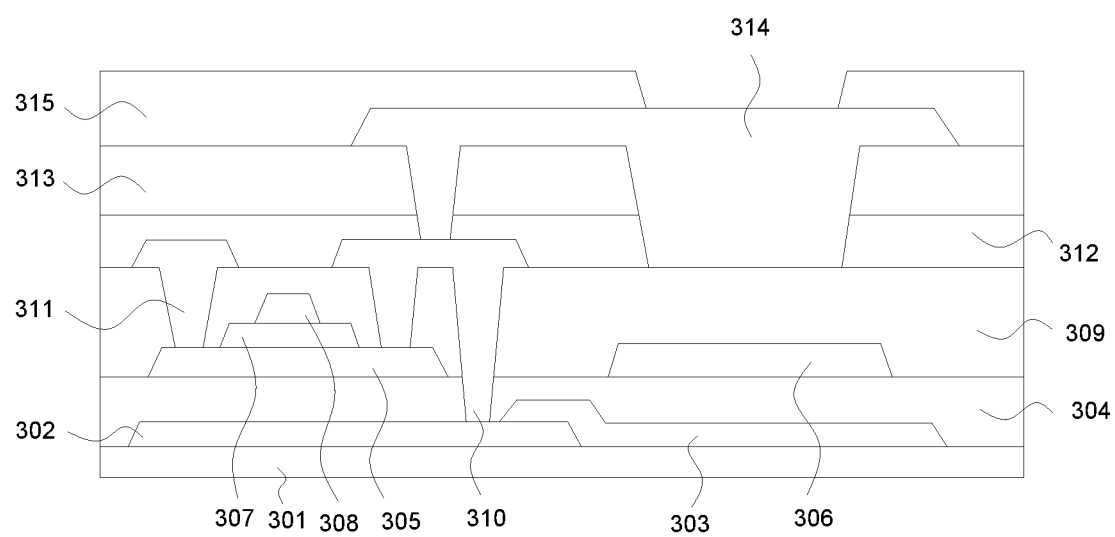
FIG. 6 is a structural view illustrating the OLED panel according to one embodiment of the present invention.

FIG. 6 is a structural view illustrating an OLED panel according to one embodiment of the present invention. As shown in FIG. 6, the OLED panel comprises: a substrate 301; a light shielding layer 302 formed on a surface of the substrate 301; a first conductive layer 303 formed on a surface of the substrate, wherein one end of the first conductive layer 303 is overlapped with the light shielding layer 302;

a buffer layer 304 covering the light shielding layer 302, the first conductive layer 303, and the substrate 301;
  an active layer 305 formed on a surface of the buffer layer 304;
  a second conductive layer 306 formed on a surface of the buffer layer 304, wherein the second conductive layer 306 and the active layer 305 are spaced apart from each other;
  a gate insulating layer 307 formed on a surface of the active layer 305;
  a gate 308 formed on a surface of the gate insulating layer 307;
  a second insulating layer 309 covering the buffer layer 304, the active layer 305, the second conductive layer 306, the gate insulating layer 307, and the gate 308;
  a drain 311 formed on a surface of the second insulating layer 309 and connected to the active layer 305 through a first via hole 3091 penetrating the second insulating layer 309;
  a source 310 formed on a surface of the second insulating layer 309, connected to the active layer 305 through a second via hole 3092 penetrating the second insulating layer 309, and connected to the light shielding layer 302 through a third via hole 3093 penetrating the second insulating layer 309 and the buffer layer 304;
  a passivation layer 312 covering the second insulating layer 309, the source 310, and the drain 311;

a planarization layer 313 formed on a surface of the passivation layer 312;

a pixel electrode 314 formed on a surface of the planarization layer 313, wherein the pixel electrode 314 is connected to the source 310 through a fourth via hole 3131 penetrating the planarization layer 313 and the passivation layer 312, and the pixel electrode 314 is in contact with the second insulating layer 309 through an opening 3132 penetrating the planarization layer 313 and the passivation layer 312; and a pixel definition layer 315 formed on surfaces of the planarization layer 313 and the pixel electrode 314, and exposing the pixel electrode 314 above the opening 3132.

In the present embodiment, the active layer 305 is disposed above the light shielding layer 302;

the second conductive layer 306 is disposed above the first conductive layer 303; and the opening 3132 is arranged above the second conductive layer 306. A width of the active layer 305 is less than a width of the light shielding layer 302;

a width of the gate insulating layer 307 is less than a width of the active layer 305; and a width of the gate 308 is less than the width of the gate insulating layer 307.

Compared with conventional techniques, the first conductive layer 303 overlaps the light shielding layer 302 in the present invention, the pixel electrode 314 is connected to the source 310, and the planarization layer 313 and passivation layer 312 in the area with the capacitor are removed. Therefore, an aperture ratio and capacitance of the OLED panel are greatly improved, the present application has a high degree of design freedom to be used in larger-sized OLED panels, and capacitance retention is improved.

Although the embodiments of the present invention have been described in conjunction with the accompanying drawings, those skilled in the art can make various modifications and variations based on the spirit and scope of the present invention, and such modifications and variations should be deemed to fall within the protection scope defined by the appended claims.

Practicability:

Compared with conventional manufacturing methods of OLED panels, the present invention can improve the aperture ratio and the capacitance of the OLED panel at the same time, has a high degree of design freedom, and can be used in large-sized OLED panels.

What is claimed is:

1. A manufacturing method of an organic light-emitting diode (OLED) panel, comprising following steps:

forming a light shielding layer on a substrate;

coating a transparent metal oxide onto the substrate and the light shielding layer, and patterning the transparent metal oxide to form a first conductive layer, wherein one end of the first conductive layer is overlapped with the light shielding layer;

sequentially depositing a buffer layer, a semiconductor layer, a first insulating layer, and a first metal layer on the substrate, and patterning the semiconductor layer, the first insulating layer, and the first metal layer to form a first semiconductor layer, a second semiconductor layer, a gate insulating layer, and a gate, wherein the first semiconductor layer and the second semiconductor layer are spaced apart from each other;

by using the gate and the gate insulating layer as a shield, performing plasma treatment on the first semiconductor layer and the second semiconductor layer to obtain an active layer and a second conductive layer spaced apart from the active layer;

forming a second insulating layer which covers the buffer layer, the active layer, the second conductive layer, the gate insulating layer, the gate insulating layer, and the gate, and patterning the second insulating layer and the buffer layer to form a first via hole which exposes the active layer, a second via hole which exposes the active layer, and a third via hole which exposes the light shielding layer;

forming a second metal layer on the second insulating layer, and patterning the second metal layer to form a source and a drain, wherein the drain is connected to the active layer through the first via hole, the source is connected to the active layer through the second via hole, and the source is connected to the light shielding layer through the third via hole;

forming a passivation layer covering the second insulating layer, the source, and the drain;

forming a planarization layer covering the passivation layer, and patterning the passivation layer and the planarization layer to form a fourth via hole which exposes the source and to form an opening which exposes the second insulating layer;

coating the planarization layer and the opening with a transparent metal oxide, and patterning the transparent metal oxide to form a pixel electrode, wherein the pixel electrode is connected to the source through the fourth via hole; and forming a pixel definition layer covering the planarization layer and the pixel electrode, and patterning the pixel definition layer to expose the pixel electrode located above the opening, wherein the first conductive layer, the buffer layer, the second conductive layer, the second insulating layer, and the pixel electrode constitute a three-layer transparent capacitor structure, wherein the opening is completely filled with the pixel electrode and penetrates the passivation layer and the planarization layer, and the opening is arranged corresponding to the three-layer transparent capacitor structure.

2. The manufacturing method of the OLED panel according to claim 1, wherein a material of the light shielding layer is one or more kinds of material selected from a group comprising molybdenum (Mo), aluminum (Al), copper (Cu), and titanium (Ti);

a thickness of the light shielding layer ranges from 2000 Å to 10000 Å; and a thickness of the first conductive layer ranges from 200 Å to 2000 Å.

3. The manufacturing method of the OLED panel according to claim 1, wherein the fourth via hole is formed by photolithography.

4. The manufacturing method of the OLED panel according to claim 1, wherein a thickness of the semiconductor layer ranges from 100 Å to 1000 Å;

a material of the semiconductor layer is one of indium gallium zinc oxide (IGZO), indium zinc tin oxide (IZTO), and indium gallium zinc tin oxide (IGZTO);

a thickness of the gate insulating layer ranges from 1000 Å to 3000 Å; and a material of the second metal layer is one or more kinds of material selected from a group comprising Mo, Al, Cu, and Ti, and a thickness of the source and the drain ranges from 2000 Å to 8000 Å.

5. The manufacturing method of the OLED panel according to claim 1, wherein a material of the second insulating layer is one or a combination of SiOx and SiNx; and
a thickness of the second insulating layer ranges from 2000 Å to 10000 Å.

6. The manufacturing method of the OLED panel according to claim 1, wherein a material of the passivation layer is one or a combination of SiOx and SiNx;
a thickness of the passivation layer ranges from 1000 Å to 5000 Å;
a material of the pixel electrode is ITO or IZO; and
a thickness of the pixel electrode ranges from 200 Å to 2000 Å.

7. The manufacturing method of the OLED panel according to claim 1, wherein the active layer is disposed above the light shielding layer;
the second conductive layer is disposed above the first conductive layer; and
the opening is arranged above the second conductive layer.

8. The manufacturing method of the OLED panel according to claim 1, wherein a width of the active layer is less than a width of the light shielding layer;
a width of the gate insulating layer is less than a width of the active layer; and
a width of the gate is less than the width of the gate insulating layer.

9. The manufacturing method of the OLED panel according to claim 1, wherein a thickness of the buffer layer ranges from 1000 Å to 5000 Å; and
a material of the buffer layer is one or a combination of SiOx and SiNx.

10. An organic light-emitting diode (OLED) panel, comprising:
a substrate
a light shielding layer disposed on a surface of the substrate;
a first conductive layer disposed on a surface of the substrate, wherein one end of the first conductive layer is overlapped and connected with the light shielding layer;
a buffer layer covering the light shielding layer, the first conductive layer, and the substrate;
an active layer disposed on a surface of the buffer layer;
a second conductive layer disposed on a surface of the buffer layer, wherein the second conductive layer and the active layer are spaced apart from each other and arranged on a same layer;
a gate insulating layer disposed on a surface of the active layer;
a gate disposed on a surface of the gate insulating layer;
a second insulating layer covering the buffer layer, the active layer, the second conductive layer, the gate insulating layer, and the gate;
a drain disposed on a surface of the second insulating layer and connected to the active layer through a first via hole penetrating the second insulating layer;
a source disposed on a surface of the second insulating layer, connected to the active layer through a second via hole penetrating the second insulating layer, and connected to the light shielding layer through a third via hole penetrating the second insulating layer and the buffer layer;
a passivation layer covering the buffer layer, the source, and the drain;
a planarization layer disposed on a surface of the passivation layer;
a pixel electrode disposed on a surface of the planarization layer, wherein the pixel electrode is connected to the source through a fourth via hole penetrating the planarization layer and the passivation layer, and the pixel electrode is in contact with the second insulating layer through an opening penetrating the planarization layer and the passivation layer; and
a pixel definition layer disposed on surfaces of the planarization layer and the pixel electrode, and exposing the pixel electrode above the opening,
wherein the first conductive layer, the buffer layer, the second conductive layer, the second insulating layer, and the pixel electrode constitute a three-layer transparent capacitor structure,
wherein the opening is completely filled with the pixel electrode and penetrates the passivation layer and the planarization layer, and the opening is arranged corresponding to the three-layer transparent capacitor structure.

11. The OLED panel according to claim 10, wherein the active layer is disposed above the light shielding layer;
the second conductive layer is disposed above the first conductive layer; and
the opening is arranged above the second conductive layer.

12. The OLED panel according to claim 10, wherein a width of the active layer is less than a width of the light shielding layer;
a width of the gate insulating layer is less than a width of the active layer; and
a width of the gate is less than the width of the gate insulating layer.

13. The OLED panel according to claim 10, a material of the light shielding layer is one or more kinds of material selected from a group comprising molybdenum (Mo), aluminium (Al), copper (Cu), and titanium (Ti);
a thickness of the light shielding layer ranges from 2000 Å to 10000 Å; and
a thickness of the first conductive layer ranges from 200 Å to 2000 Å.

14. The OLED panel according to claim 10, wherein the fourth via hole is formed by photolithography.

15. The OLED panel according to claim 10, wherein
a thickness of the second metal layer ranges from 1000 Å to 3000 Å; and
a material of the source and the drain is one or more of Mo, Al, Cu and Ti, and a thickness of the source and the drain ranges from 2000 Å to 8000 Å.

16. The OLED panel according to claim 10, wherein a material of the second insulating layer is one or a combination of SiOx and SiNx; and
a thickness of the second insulating layer ranges from 2000 Å to 10000 Å.

17. The OLED panel according to claim 10, wherein a material of the passivation layer is one or a combination of SiOx and SiNx;
a thickness of the passivation layer ranges from 1000 Å to 5000 Å;
a material of the pixel electrode is ITO or IZO; and
a thickness of the pixel electrode ranges from 200 Å to 2000 Å.

18. The OLED panel according to claim 10, wherein a thickness of the buffer layer ranges from 1000 Å to 5000 Å; and a material of the buffer layer is one or a combination of SiOx and SiNx.

\* \* \* \* \*